United States Patent [19]
Trimberger

[11] Patent Number: 5,892,961
[45] Date of Patent: Apr. 6, 1999

[54] FIELD PROGRAMMABLE GATE ARRAY HAVING PROGRAMMING INSTRUCTIONS IN THE CONFIGURATION BITSTREAM

[75] Inventor: Stephen M. Trimberger, San Jose, Calif.

[73] Assignee: Xilinx, Inc., San Jose, Calif.

[21] Appl. No.: 920,738

[22] Filed: Aug. 29, 1997

Related U.S. Application Data

[63] Continuation of Ser. No. 389,846, Feb. 17, 1995, abandoned.

[51] Int. Cl.$^6$ ..................................................... G06F 13/00
[52] U.S. Cl. .......................... 395/800.1; 326/39; 364/489
[58] Field of Search ................................ 395/800.1, 376; 326/38, 39; 364/489; 365/182; 711/100

[56] References Cited

U.S. PATENT DOCUMENTS

| | | | |
|---|---|---|---|
| 3,849,760 | 11/1974 | Endou et al. | 382/205 |
| 5,394,031 | 2/1995 | Britton et al. | 326/38 |
| 5,457,408 | 10/1995 | Leung | 326/38 |

OTHER PUBLICATIONS

D.D. Gajski, et al, "Computer Architecture" IEEE Tutorial Manual, IEEE Computer Society, 1987, pp. v–i.

"New IEEE Standard Dictionary of Electrical and Electronics Terms", Fifth Edition, 1993, p. 1011.

Hodges, et al, "Analog MOS Integrated Circuits" IEEE Press, 1980, pp. 2–11.

David A. Patterson and John L. Hennessy, "Computer Architecture: A Quantitive Approach", pp. 200–201, 1990.

"The Programmable Logic Data Book" copyright 1994, Xilinx, Inc., 2100 Logic Drive, San Jose, CA 95124, pp. 2–105 to 2–132.

*Primary Examiner*—Meng-Ai T. An
*Assistant Examiner*—Walter D. Davis, Jr.
*Attorney, Agent, or Firm*—Edel M. Young; LeRoy D. Maunu, Esq.

[57] ABSTRACT

A programmable gate array (FPGA) comprises a CPU coupled to a configuration memory array. Bitstream data used for configuring the configuration memory array is encoded to combine programming instructions and configuration data. The CPU receives and decodes the encoded bitstream data, and executes the programming instructions to efficiently load configuration data into the configuration memory array. For instance, configuration data can be temporarily stored in the CPU and reused where data patterns in the configuration memory array repeat. Use of the programmable CPU for loading the configuration memory array reduces the amount of data transmitted to the FPGA during array configuration.

30 Claims, 7 Drawing Sheets

| OP CODE | INSTRUCTION |
|---|---|
| LF xxx | load frame immediate with bits xxx |
| LFN N,xxx | load N bits, xxx, into frame register |
| WR X | program row X |
| RD X | read back X into frame reg. |
| RB | read back frame register |
| JUMP xx | jump to xx in memory |

FIELD PROGRAMMABLE GATE ARRAY HAVING PROGRAMMING INSTRUCTIONS IN THE CONFIGURATION BITSTREAM

This application is a continuation of application Ser. No. 08/389,846, filed Feb. 17, 1995, now abandoned.

BACKGROUND OF THE INVENTION

1. Field of the Invention

This invention relates to gate arrays, and more particularly to a field programmable gate array in which programming instructions are carried by the configuration bitstream and executed by a CPU in the logic cell array.

2. Description of the Background Art

Digital logic can be implemented using several options: discrete logic devices, often called small-scale integrated circuits or SSI, programmable devices such as programmable logic arrays (PLAs) or programmable logic devices (PLDs), masked-programmed gate arrays or cell-based application specific integrated circuits (ASICs), and field programmable gate arrays (FPGAs).

FPGAs are general purpose programmable devices that are customized by the end users. FPGAs are composed of an array of configurable logic blocks that are programmably interconnected. The basic device architecture of an FPGA consists of an array of configurable logic blocks (CLBs) embedded in a configurable interconnect structure and surrounded by configurable I/O blocks (IOBs). An IOB allows signals to be driven off-chip or optionally brought into the FPGA. The IOB can typically perform other functions, such as tri-stating outputs and registering incoming or out-going signals. The configurable interconnect structure allows users to implement multi-level logic designs (multi-level refers to logic in which the output signal of one logic unit provides input to another logic unit and the output of that provides input to another, etc.). An FPGA can support tens of thousands of gates of logic operating at system speeds of tens of megahertz. The FPGA is programmed by loading programming data into the memory cells controlling the configurable logic blocks, I/O blocks, and interconnect structure. Further information about FPGAs appears in "The Programmable Logic Data Book", copyright 1994 by Xilinx, Inc. and available from Xilinx, Inc. at 2100 Logic Drive, San Jose, Calif. 95124, which is incorporated herein by reference.

Each configurable logic block in the FPGA can include configuration memory cells for controlling the function performed by that logic block. These configuration memory cells can implement a lookup table, control multiplexers, and control other logic elements such as XOR gates and AND gates. A lookup table stores a truth table which implements that combinational logic function corresponding to the truth table. Each configurable logic block may also be defined to include an adjacent portion of the interconnect structure. The interconnect structure includes programmable interconnect points which control the connection of wiring segments in the programmable interconnect network of the FPGA. Each programmable interconnect point may be a pass transistor controlled by a configuration memory cell. Wire segments on each side of the pass transistor are either connected or not connected depending on whether the transistor is turned on by the corresponding configuration memory cell. The multiplexer is a special-case one-directional routing structure that is controlled by a configuration memory cell. Although the multiplexer can be any width, controlling multiplexers with many inputs will require additional configuration memory cells. Switches that are built using multiplexers require fewer configuration memory cells than the number of multiplexer inputs.

Configuration is the process of loading a bitstream containing the program data into the configuration memory cells which control the configurable logic blocks and I/O blocks of the FPGA. The bitstream is loaded into the FPGA serially to minimize the number of pins required for configuration and to reduce the complexity of the interface to external memory. The bitstream is broken into packets of data called frames. As each frame is received, it is shifted through a frame register until the frame register is filled. The data in the frame register of the FPGA are then loaded in parallel into one row of configuration memory cells forming the memory array. (The configuration memory cells which control a configurable logic block typically occupy a two dimensional section of the array.) The configuration memory cells make up the lookup tables and control the programmable interconnect points, multiplexers, and other programmable elements of a configurable logic block or I/O block. Following the loading of the first frame, subsequent frames of bitstream data are shifted into the FPGA, and another row of configuration memory cells in the array of CLBs is designated to be loaded with a frame of bitstream data.

A limitation on the speed at which configuration of the FPGA occurs is the serial loading of the bitstream into the FPGA. This configuration bitstream bottleneck has become increasingly apparent as the number of configuration bits has increased from thousands to tens and hundreds of thousands of bits over the past several years. This dramatic increase in FPGA size has resulted in a corresponding increase in the time required for configuration and reconfiguration. As the bitstream length increases in the future to millions of bits and beyond, an alternative method of loading bitstream data must be developed. What is needed is a method and system for efficiently loading bitstream data into an FPGA for rapid configuration and reconfiguration of the memory cell array.

SUMMARY OF THE INVENTION

In accordance with the present invention, the bitstream includes programming instructions in order to reduce the number of data bits which must be transferred into the FPGA. An encoded bitstream is intercepted by a central processing unit (CPU), prior to the bitstream data being loaded into the frame register. These instructions encoded in the bitstream cause the CPU to perform data operations on a frame before the frame data is loaded into the configuration memory, and thereby enable efficient loading of the configuration memory array. For example, data from the encoded bitstream may be loaded into several locations in the configuration memory without having to be repeated in the encoded bitstream, or data may be moved from one location in the configuration memory to another without having to be present in the bitstream.

The processor contains a configurable logic block (CLB) register, for use by the processor as a temporary storage area. This CLB register enables local storage of repetitively used bitstream segments.

BRIEF DESCRIPTION OF THE DRAWINGS

FIG. 3 depicts a table containing exemplary instructions used in programming the CPU of the present invention;

DESCRIPTION OF THE PREFERRED EMBODIMENT

Figure 1:
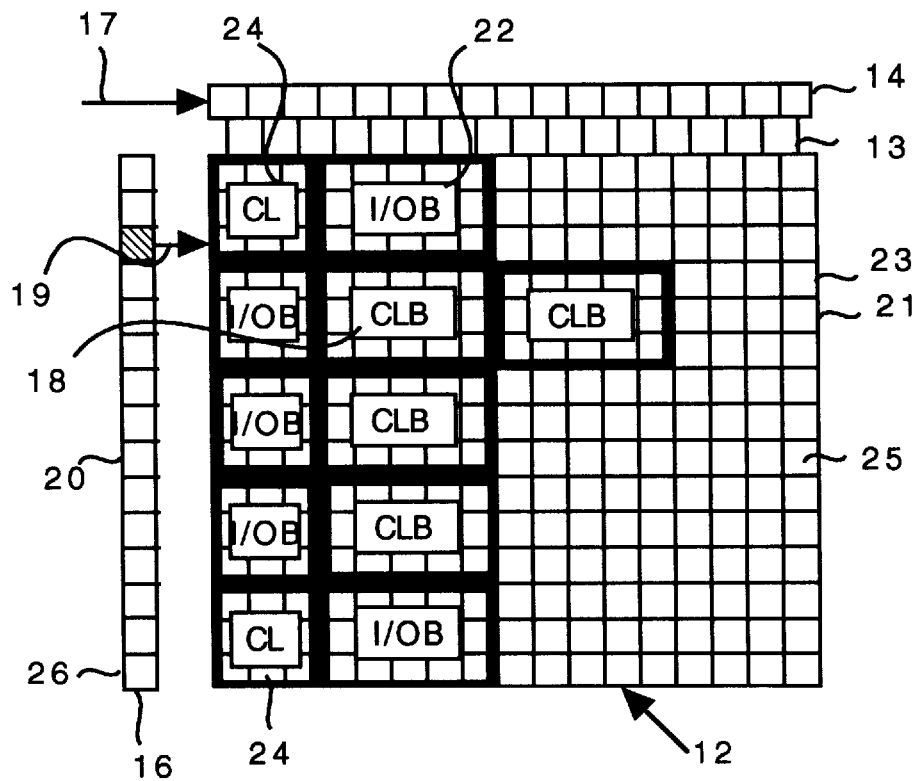
FIG. 1 depicts a simplified section of a field programmable gate array architecture of the prior art, outlining the layout of programming registers that are used for programming the field programmable gate array.

Referring now to FIG. 1, an overview diagram is shown depicting the architecture of a conventional Logic Cell Array (LCA) 10 field programmable gate array (FPGA). Configuration memory array 12 consists of a matrix of memory cells 25 which function, among other things, as look-up table memory and routing selectors in the implementation of FPGA logic. A detailed description of the organization of the configuration memory array 12 can be found in the Programmable Logic Data Book, pages 2-105 to 2-132, published by Xilinx, Inc., 1994. The matrix of memory cells 25 is organized in regular discrete arrays of discrete Configurable Logic Blocks 18 (CLBs). The CLB's 18 of configuration memory array 12 are shown as 3×5 arrays of memory cells 25. In an actual FPGA the CLB is generally much larger than 3×5 memory cells 25. The CLBs 18 are bounded on all four sides by input/output blocks (IOBs) 22. The IOBs 22 communicate data between external pins (not shown) of the FPGA and the CLBs 18. Corner logic blocks 24 are located in each of the four corners of the configuration memory array 12. The corner logic blocks 24 perform special functions and will be discussed further with reference to FIG. 4 below. Loading of data into configuration memory array 12 is performed from a frame register 14, shown in FIG. 1 above the configuration memory array 12, and connected to the configuration memory array 12 by connect lines 13. Frame register 14 is a conventional serial shift register which receives and sequentially clocks bitstream 17 into the frame register 14 from left to right.

The CLBs 18 and IOBs 22 are configured by shifting bitstream 17 into frame register 14 and then loading the contents of frame register 14 in parallel into rows of the memory array 12. In order to facilitate the parallel loading of bitstream 17 from frame register 14 into a row of the memory array 12, a row pointer 19 in shift register 16 points sequentially to each row such as rows 21, 23. Shift register 16 consists of a sequential series of pointer cells 20, each storing a logic "0", with the exception of one bit storing a logic "1" which is referred to as the row pointer 19. The row pointer 19 shifts sequentially through the shift register 16 starting from the bottom cell 26 to sequentially load the contents of the configuration memory array 12 on a row-by-row basis. For example, during loading of the configuration memory array 12, row pointer 19 will at some point be addressing row 21. Pointer 19 causes the data in frame register 14 to be loaded into row 21. Following the loading of the contents of frame register 14 into row 21, the row pointer 19 shifts up one pointer cell 20 and points to row 23 of the configuration memory array 12. With row pointer 19 addressing row 23, frame register 14 sequentially shifts in a new frame of bitstream 17, and once the frame register 14 is completely loaded, the contents of frame register 14 is loaded in parallel to row 23 of the memory array 12. In this manner, each of the rows of configuration memory array 12 is sequentially loaded with a frame of bitstream 17.

FPGA Architecture

Figure 2:
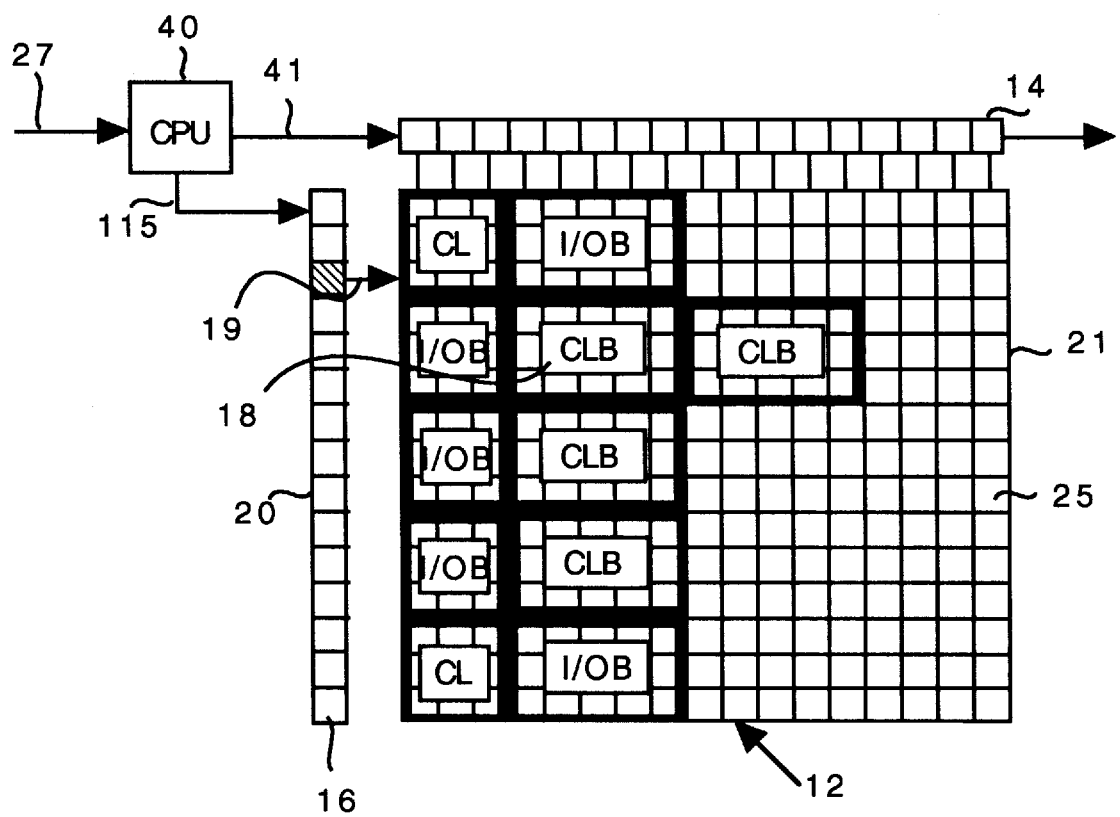
FIG. 2 depicts the field programmable gate array architecture of the present invention, outlining the layout of configuration registers and the CPU.

Referring now to FIG. 2, one embodiment of the present invention is shown, in which encoded bitstream 27 is received by a Central Processing Unit (CPU) 40 for decoding. In contrast to the conventional bitstream 17 (FIG. 1), which is comprised of a series of data bits for direct loading into frame register 14, the encoded bitstream 27 of the present invention consists of a sequence of programming instructions combined with configuration data. These instructions comprising the encoded bitstream 27 enable the CPU 40 to load the frame register 14 via frame data path 41. Frame data path 41 is a data path connecting CPU 40 to the frame register 14. Frame data path 41 carries frames of bitstream data used in configuring the CLB's 18. Use of the CPU 40 enables a single instruction carried in the encoded bitstream 27 to perform multiple repetitive or common data-loading tasks with respect to configuration memory array 12. For instance, an instruction which might be executed on the configuration memory array 12 would be to load the entire configuration memory array with logic "1's." To perform this task using conventional techniques, a bit containing a logic "1" would need to be transmitted to the FPGA for each memory cell 25 contained in the configuration memory array 12. Depending on the size of the FPGA, this might require the transfer of tens or hundreds of thousands of bits. Using the CPU 40 of the present invention, a single instruction such as CLR, containing only a few bits, can notify CPU 40 to clear the entire configuration memory array by loading logic "1's" into each of the memory cells 25. The CPU 40 then generates a sequence of "1's" equal to the length of the frame register 14 and transmits the sequence along frame data path 41 to the frame register 14. The contents of the frame register 14 is then transmitted into the configuration memory array 12, as discussed with respect to FIG. 1 above. For each row that is loaded by the frame register 14, the CPU 40 sends a signal along control bus 115 to the shift register 16 to sequentially increment the frame pointer 19 after each row 21 is loaded into the configuration memory array 12. Alternatively, if CPU 40 loads 1's into all rows of shift register 16, all rows of configuration memory 12 are cleared simultaneously. From this simple example, it can be seen that through the use of programming instructions transmitted in the encoded bitstream 2, CPU 40 can greatly improve the transfer efficiency of data to the FPGA and into the configuration memory array 12.

As an alternative example, the requirement of the FPGA may be to load each CLB 18 of the configuration memory array 12 with the same data set. In this case, an instruction and the CLB data are transmitted via encoded bitstream 27 instructing CPU 40 to load all CLBs 18 with a single set of CLB data. Using this instruction, CPU 40 generates appropriate data for each row of each of the CLBs 18 and loads this data into the configuration memory array 12. Using conventional bitstream formats, the loading of all the CLBs in the configuration memory array would have required transmission to the FPGA of a data stream equal to the size of the configuration memory array 12. Using the present invention, only a single instruction, along with the data required to load a single CLB 18, need be transmitted. The CPU 40 can then generate data for frame register 14 for loading into the CLBs 18.

Referring now to FIG. 3, a table 29 is shown identifying a list of example operation codes (OPCODE) 31 (CPU instructions) and their respective instruction definitions (INSTRUCTION 33), which may be used with the CPU 40 of the present invention. The first opcode 31 listed in FIG. 3 is LF, which represents the instruction Load Frame Immediate. The function of the LF instruction is to load the configuration data contained in the encoded bitstream 27 immediately following the instruction into the frame register 14. In decoding this instruction, the CPU 40 reads a data word immediately following the instruction from the encoded bitstream 27, and loads the data word onto the frame data path 41 for transfer into the frame register 14. The contents of the frame register 14 may then be loaded into the row of configuration memory array 12 pointed to by frame pointer 19, using the WR X instruction.

The second example opcode 31 listed in FIG. 3 is LFN N, which is shorthand notation for Load N bits into the frame register 14. The preferred implementation of this instruction results in CPU 40 reading some number (N) of bits from the encoded bitstream 27, and loading these N bits onto the frame data path 41. These N bits are then transferred into the frame register 14, as determined by CPU 40.

The third example instruction in the table 29 of FIG. 3 is the opcode 31 instruction WR X, which stands for Program Row X. The function of WR X is to load the contents of frame register 14 into a specific row 21, designated by address X. Using this instruction, the row pointer 19 can be set as discussed below with reference to FIG. 7, and the CPU 40 can then load a specific row 21. By sending multiple repetitive WR X commands, a single frame register can efficiently load multiple rows, as identified by the various addresses defined by the X attribute.

The fourth example command, RD X, instructs the CPU 40 to read a specific row X into frame register 14. This command is useful in combination with WR X, in that a single row X can be read into frame register 14 and then subsequently written into a different row.

The next example instruction shown in FIG. 3 is RB, which stands for Read Back the frame register 14. The RB command instructs CPU 40 to shift the contents of the frame register 14 outward to the right to a designated output pin (not shown) on the FPGA. This may be used to check the contents of the data stored in the configuration memory array 12.

The last example instruction shown in FIG. 3 is Jump XX. The Jump XX instruction enables the CPU 40 to control the addressing of memory external (not shown) to the FPGA. The CPU sends a signal to the external memory to instruct the memory to begin sending encoded bitstream 27 data beginning at memory location XX in external memory. In an alternative embodiment, the Jump XX instruction may be executed conditionally, based on the contents of an internal register. This Jump XX instruction is discussed in more detail with reference to FIG. 7 below.

These exemplary instructions of FIG. 3 are listed only to illustrate the functional capability of CPU 40, and are in no way intended to define the limits or represent the totality of possible instructions which the CPU 40 can implement. It will be obvious to those skilled in the art that a wide range of possible instructions could be equivalently used to manipulate data and control data flow into and out of configuration memory array 12.

CPU Description

Figure 4:
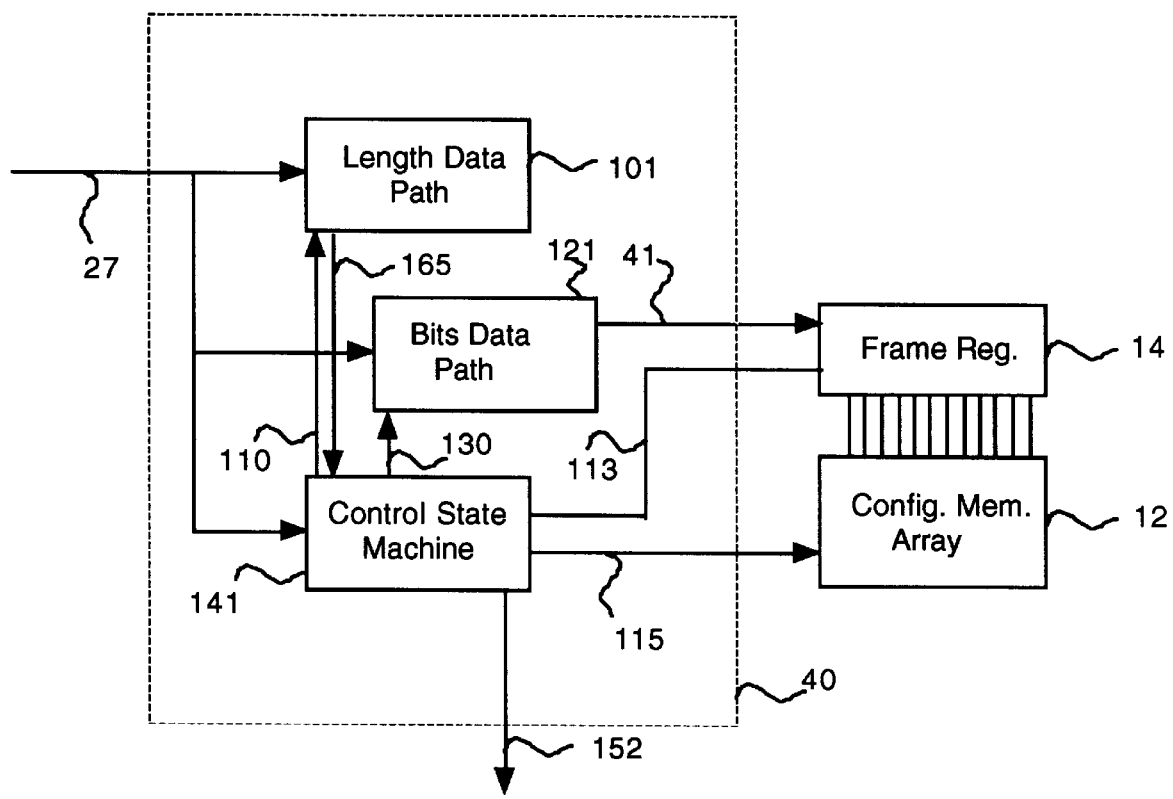
FIG. 4 depicts a schematic representation of the CPU architecture of the present invention.

Referring now to FIG. 4, a circuit block diagram is shown illustrating the architectural overview of the CPU 40. CPU 40 contains three major structures: length data path logic 101, bits data path logic 121, and control state machine 141. The function of each of the components (101, 121, and 141) of the CPU 40 will be discussed in detail with reference to the figures that follow. CPU 40 receives encoded bitstream 27 into length data path logic 101, the bits data path logic 121, or the control state machine 141, as determined by logic in the control state machine 141. The function of the length data path logic 101 is to store values, to count numbers of bits, to read data bits serially into internal registers and to count various other events in the execution of CPU 40 instructions. Bits data path logic 121 receives the encoded bitstream 27 and sequentially shifts the encoded bitstream 27 to the frame register 14 along frame data path 41. Control state machine 141 also receives encoded bitstream 27; decodes the opcode commands from the encoded bitstream 27; and provides control signals to the various components of the CPU 40, into the frame register 14, and configuration memory array 12. Control state machine 141 also provides a next instruction address 152 which is routed off-chip of the FPGA and used to control memory logic, as in the Jump XX command discussed above. Control state machine 141 communicates with the length data path logic 101 through the frame data bus 109 and a control bus 110. Communication between the control state machine 141 and the bits data path logic 121 is performed through control bus 130. Communication between the control state machine 141 and the frame register 14 occurs through control bus 113, and communication between the control state machine 141 and the configuration memory array 12 is through control bus 115.

Figure 5:
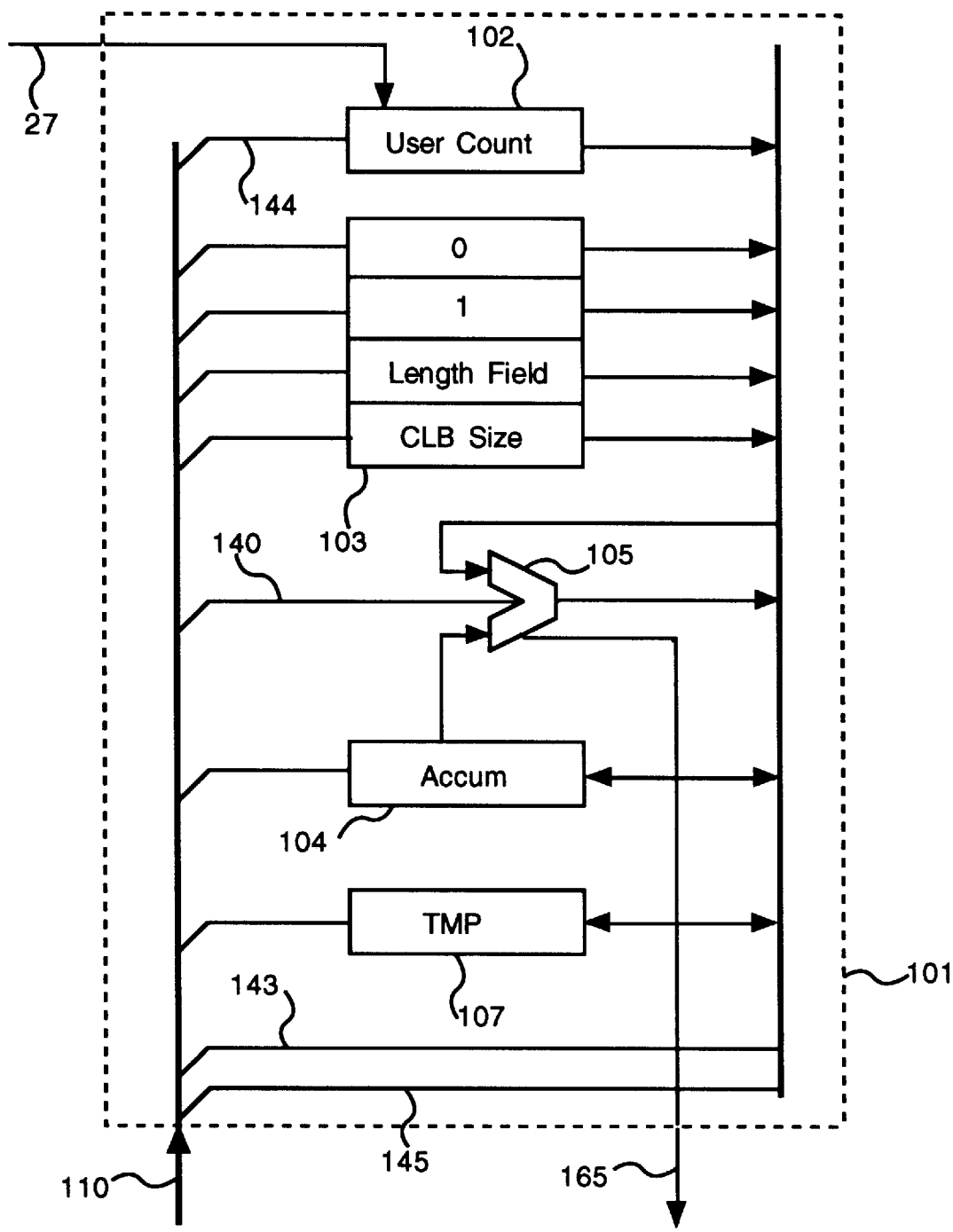
FIG. 5 depicts a detailed circuit block diagram illustrating the architectural components of the length data path logic of FIG. 4.

Referring now to FIG. 5, a detailed circuit block diagram is shown illustrating the architectural components of length data path logic 101. Encoded bitstream 27 is received by a user count register 102 in a bit-serial fashion. The user count register 102 stores the bits, and in response to signals from control bus 110, can transfer the data in parallel to temporary register 107 or to accumulator 104 via data bus 109. The transfer of data from the encoded bitstream 27 into the user count register 102 is enabled by control state machine 141 via user count enable line 144. User count enable line 144 carries one of several control signals originating from the control state machine 141 and transmitted to the length data path logic 101 via control bus 110.

Length data path logic 101 contains an array of memory locations identified as constant registers 103. These constant registers 103 contain a plurality of stored constants which are used by control state machine 141 in counting constant data and field lengths. Examples of data which may be contained in constant registers 103 include the constants "0" and "1" as well as the length of a prescribed data field, the length in bits of the frame register 14, and the size of a standard CLB 18 (FIG. 1). In the preferred embodiment, the content of the constant register 103 is programmed as fixed memory; however, one skilled in the art would recognize that this constant register 103 can be constructed using dynamic read/write memory, thus enabling the register to be programmed and dynamically updated with a variety of constant values.

The length data path logic 101 also contains a register called the accumulator 104 which is connected to the frame data bus 109. One or more temporary registers 107 may optionally be used with the length data path logic 101 to serve as temporary storage locations for specific instruction commands. A conventional Arithmetic Logic Unit (ALU) 105, also connected to the frame data bus 109, receives input from the accumulator 104 to provide arithmetic logic results to frame data bus 109. Results may be stored back in accumulator 104 or in the temporary register 107. Constant register 103, accumulator 104 and temporary register 107 are all enabled by control bus 110. The ALU 105 receives a length data path operation signal 140 from the control state machine 141. The length data path operation signal 140 controls the arithmetic function to be performed by the ALU 105. A length data path source signal 143 controls and selects which of the signals of the length data path logic 101 has access to the frame data bus 109. A length data path destination signal 145 controls which of the elements of the length data path logic 101 is addressed by the frame data path 109. For example, the length data path destination signal might control the frame data path 109 to write data to the ALU 105, but not the accumulator 104 or the temporary register 107. The ALU 105 further generates an A=0 signal 165 when the value of the accumulator is equal to zero. This A=0 signal 165 is useful, for instance, for detecting when a decrement operation being performed by the ALU 105 is completed.

Figure 6:
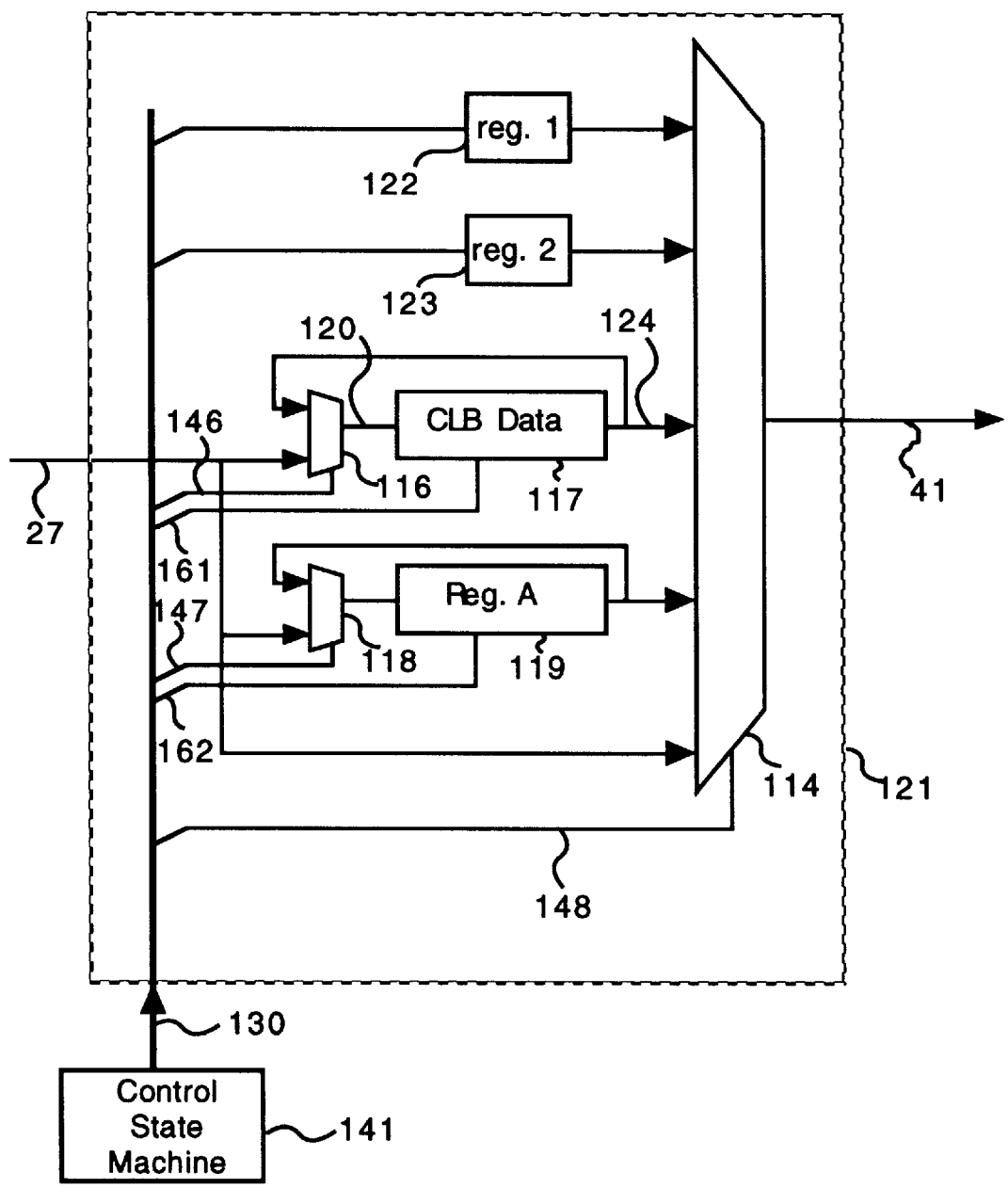
FIG. 6 depicts a circuit block diagram detailing the architectural configuration of the bits data path logic of FIG. 4.

Referring now to FIG. 6, a circuit block diagram is shown detailing the architectural configuration of the bits data path logic 121. As stated above, the function of the bits data path logic 121, is to transfer data from the encoded bitstream 27 to frame register 14. Bits data path logic 121 principally comprises a multiplexer 114 which selects from among several data sources in response to a multiplexer control signal 148 from control bus 130. Control bus 130 originates from the control state machine 141. A first register 122 and second register 123 are two of the data sources received by the multiplexer 114. The first register 122 and the second register 123 enable the CPU 40 to generate a stream of values to be loaded into the frame register 14 by selectively reading from each of the registers 122, 123 in response to multiplexer control signal 148 sent via control bus 130. Encoded bitstream 27 also has a direct path through multiplexer 114 to frame data path 41. Alternatively, frame data path 41 can connect through the multiplexer 114 to a CLB data register 117 or an optional register A 119. CLB data register 117 and register A 119 are identical in structure and operation. CLB data register 117 is a sequential shift register into which data is loaded from encoded bitstream 27.

To load all CLB's 18 (FIG.2) in a row 21 identically from the encoded bitstream 27, the control state machine 141 sends a CLB data select signal 161 via the control bus 130 to the CLB data register 117. A block of data is then loaded into the CLB data register 117 from the encoded bitstream 27. Once the CLB data is loaded into the CLB data register 117, the entire block of CLB data contained in CLB register 117 can be repetitively shifted through multiplexer 114 along frame data path 41. Cycling (also known in the art as data recirculation) of the CLB data into the CLB data register 117 is achieved by controlling multiplexer 116 to select the feedback signal which comes from output line 124 of CLB data register 117. As data shifts out of CLB data register 117 to frame data path 41, the same CLB data register output 124 cycles back to the input 120 of the CLB data register 117 to create a data loop. Once the entire contents of the sequential CLB data register 117 has been shifted out, the contents of the CLB data register has again been loaded into the CLB data register 117 and is ready for re-use. In the same way register A 119 has a multiplexer 118 controlled by a register A data enable 148 signal, originating from the control bus 130, and can also be used to recycle data. The register A is enabled from the control state machine 141 by register A data select 162.

Figure 7:
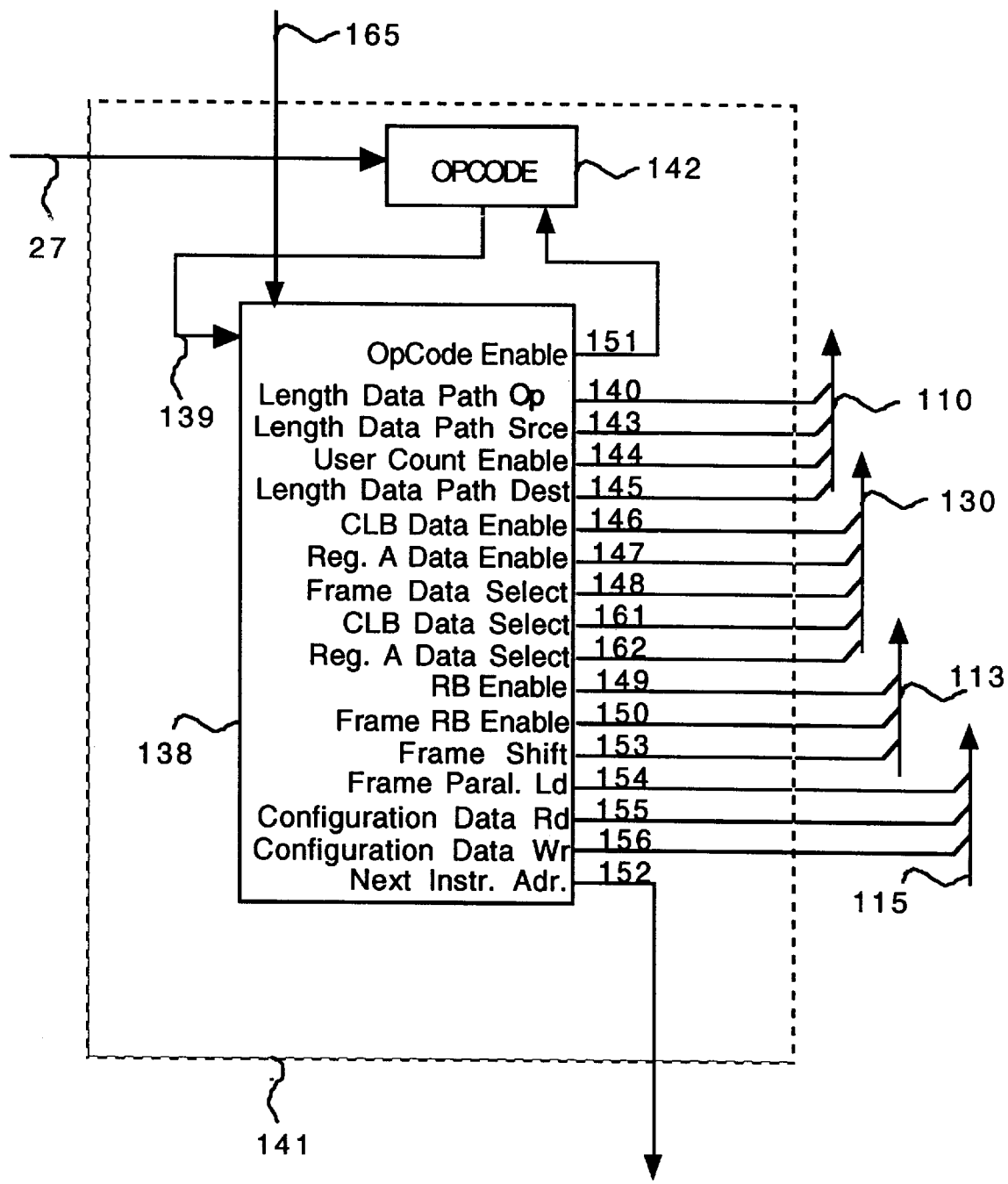
FIG. 7 depicts a circuit block diagram illustrating architectural details of the control state machine of FIG. 4.

Referring now to FIG. 7, a circuit block diagram is shown illustrating architectural details of the control state machine 141. The control state machine receives encoded bitstream 27 into an opcode register 142. An opcode is stripped from the encoded bitstream 27 and transferred to decoder logic 138 along opcode data path 139. The structure of decoder logic 138 is conventional, and may be implemented as combinational or sequential digital logic or in software. The decoding of the opcode in decoder logic 138 results in the production of a variety of control signals (140, 143–156, 161, 162). Among the control signals produced in decoder logic 138, is an opcode enable signal 151 which is used to enable the loading of an opcode from the opcode register 142 to the opcode decoder logic 138. The length data path operation 140, length data path source 143, user count enable 144, and length data path destination 145 signals are all carried on the control bus 110, which is transmitted to the length data path logic 101 (FIG. 5). The CLB data enable 146, register A data enable 147, frame data select 148, CLB data select 161, and register A data select 162 signals are carried on the control bus 130, which is used in the operation of the bits data path logic 121 (FIG. 6).

Frame readback enable 150, readback enable 149, and frame shift signal 153 are combined to produce control bus 113 which connects the control state machine 141 to the frame register 14 as shown in FIG. 4. Frame parallel load 154, configuration data read 155, and configuration data write 156, combine to produce control bus 115 which connects control state machine 141 to the configuration memory array 12 as also shown in FIG. 4. The frame parallel load 154 signal directs the shift register 16 to load a new value from the configuration memory array 12. The configuration data read signal 155 controls the writing of configuration data from the configuration memory array 12 to the frame register 14. The configuration data write signal 156 controls the writing of configuration data from the frame register 14 to the configuration memory array 12. A next instruction address 152 signal is produced and transmitted off the chip to control memory logic (not shown) in support of the FPGA. The next instruction address 152 signal is used in the Jump XX instruction, as discussed above with reference to FIG. 3.

Instruction Processing

The CPU has two data paths (the length data path 101 and the bits data path 121) and a control state machine 141. Encoded bitstream 27 is initially shifted serially into the opcode register 142 of the control state machine 141. The contents of the opcode register 142 are then decoded to control the direction of subsequent bits in the encoded bitstream 27.

When the LF instruction (FIG. 3) is decoded in the opcode register 142, the control state machine 141 performs the following functions:

i) The length data path destination 145 signal is set to load the accumulator 104 with a value from the frame size constant register 103 representing the number of bits in a bitstream frame.

ii) The frame data select 148 signal is set to control the multiplexer 114 to select the encoded bitstream 27 as an input, and to pass the encoded bitstream 27 along the frame data path 41 to the frame register 14.

iii) The frame shift 153 signal is set to enable the frame register 14 to accept data from the frame data path 41.

iv) The length data path logic 101 ALU 105 is set to decrement the input value received from the accumulator 104. The instruction for the ALU 105 to decrement is provided by the length data path operation signal 140 from the control state machine 141. The length data path source 143 selects the ALU 105, and the length data path destination 145 puts the result back into the accumulator 104. The frame register 14 passes data until an A=0 signal 165 is received from the length data path logic 101 ALU 105.

v) When the A=0 signal 165 is received by the control state machine 141, the control state machine 141 stops passing data into the frame register 14 and sets the opcode enable 151 signal to begin loading another opcode into the opcode register 142.

When the LFN instruction (FIG. 3) is decoded in the opcode register 142, the control state machine 141 performs the following functions:

i) The length field constant from the constant register 103 is loaded into the accumulator 104 of the length data path logic 101;

ii) The user count enable 144 signal is set to direct the encoded bitstream 27 into the user count register 102;

iii) The length data path logic 101 ALU 105 is set to decrement the input value received from the accumulator 104. The length data path source 143 signal selects the ALU 105, and the length data path destination 145 signal puts the result back into the accumulator 104. The frame register 14 passes data until an A=0 signal 165 is received from the length data path logic 101 ALU 105.

iv) The control state machine 141 waits for receipt of an A=0 signal 165 from the ALU 105, indicating that all bits have been loaded into the user count register 102.

v) The accumulator 104 is loaded with the contents of the user count register 102.

vi) The frame data select 148 signal is set so that multiplexer 114 selects the encoded bitstream 27 as an input, and passes the encoded bitstream 27 along frame data path 41 to the frame register 14.

vii) The frame shift signal 153 is set to allow the frame register 14 to accept the frame data 41.

viii) The length data path ALU 105 is set to decrement the input value received from the accumulator 104. The length data path source 143 selects the ALU, and the length data path destination 145 puts the result back into the accumulator 104. The frame register 14 passes data until an A=0 signal 165 is received from the length data path logic 101 ALU 105.

ix) Multiplexer 114 continues to pass data until an A=0 signal 165 is received from the length data path logic 101 ALU 105.

x) When the A=0 signal 165 is received, the control state machine 141 stops transferring data to the frame register 14 and sets the opcode enable 151 signal to begin loading another opcode into the opcode register 142.

When the WR instruction is decoded in the opcode register 142, the control state machine 141 performs the following functions:

i) The accumulator 104 is loaded with the length field constant from the constant register 103.

ii) The user count enable 144 signal is set to direct the encoded bitstream 27 into the user count register 102.

iii) The length data path logic 101 ALU 105 is set to decrement the input value received from the accumulator 104. The length data path source 143 selects the ALU 105 and the length data path destination 145 puts the result back into the accumulator 104. The frame register 14 passes data until an A=0 signal 165 is received from the length data path logic 101 ALU 105.

iv). The control state machine 141 waits for receipt of an A=0 signal 165 from the ALU 105 indicating that all bits from the encoded bitstream 27 have been loaded into the user count register 102.

v) The frame parallel load signal 154 is set which directs the shift register 16 to load a new value.

vi) When the shift register 16 has the new value, the control state machine 141 sets the configuration data write 156 signal to allow the data in the frame register 14 to be loaded into the configuration memory array 12.

vii) The opcode enable 151 signal is set to begin loading another opcode into the opcode register 142.

When the RD instruction is decoded in the opcode register 142, the control state machine 141 performs the following functions:

i) The frame parallel load 154 signal and the configuration data read signal 155 are set to allow one frame of configuration data to be loaded into the frame register 14 from the configuration memory array 12.

ii) When the frame register 14 contains the data from the configuration memory array 12, the control state machine 141 sets the readback enable signal 149 which directs the frame register 14 to shift its contents out of an off-chip readback pin (not shown).

iii) When the frame bits have been shifted out of the off-chip readback pin, the opcode enable 151 signal is set to begin loading another opcode into the opcode register 142.

When the JMP instruction is decoded in the opcode register 142, the control state machine 141 performs the following functions:

i) The accumulator 104 is set with the length field constant from the constant register 103.

ii) The user count enable signal 144 is set to direct the encoded bitstream 27 into the user count register 102.

iii) The length data path logic 101 ALU 105 is set to decrement the input value received from the accumulator 104. The length data path source 143 selects the ALU 105, and the length data path destination 145 puts the result back into the accumulator 104. The frame register 14 passes data until an A=0 signal 165 is received from the length data path logic 101 ALU 105.

iv) When the A=0 signal 165 is received by the control state machine 141, indicating that all bits have been loaded into the user count register 102, the next instruction address 152 signal is set which directs the contents of the user count register 102 to be transferred to the bitstream instruction address pin (not shown).

vi) The external memory (not shown) then begins sending data from the new address.

vii) The opcode enable 151 signal is set to begin loading another opcode into the opcode register 142.

What is claimed is:

1. A programmable gate array comprising:

a bitstream comprising a combination of configuration data and programming instructions;

a processor coupled to the bitstream for separating the configuration data from the programming instructions and for executing the programming instructions and having a control state machine coupled to receive the configuration bitstream for decoding programming instructions and providing control signals; and an arithmetic logic unit coupled to receive a control signal from the control state machine and for performing arithmetic functions in response to programming instructions in the bitstream; and a memory array having a plurality of memory cells for receiving and storing configuration data transmitted from the processor.

2. The programmable gate array according to claim 1 in which the processor generates a plurality of control signals in response to the programming instructions.

3. The programmable gate array according to claim 2 in which the memory stores configuration data responsive to at least one of the control signals generated by the processor.

4. The programmable gate array of claim 1, further comprising, an accumulator register coupled to receive data from the arithmetic logic unit and provide data to the arithmetic logic unit.

5. A programmable gate array that is programmable with a bitstream having a combination of configuration data and programming instructions, comprising:

a memory array having a plurality of memory cells for storing configuration data;

a frame register coupled to the memory array for receiving configuration data from the bitstream and transferring the configuration data to the memory array; and a processor coupled to the frame register for controlling the transfer of configuration data to the memory array, the processor being responsive to programming instructions in the bitstream and having a control state machine coupled to receive the bitstream for decoding the programming instructions in the bitstream and providing control signals; and an arithmetic logic unit coupled to receive a control signal from the control state machine for performing arithmetic functions in response to the programming instructions in the bitstream.

6. The programmable array according to claim 5 further comprising a shift register coupled to the processor for addressing rows of the memory array in which each cell of the shift register stores a row pointer identifying a row to be addressed.

7. The programmable array according to claim 5 further comprising a data bus for coupling the processor to the frame register.

8. The programmable array according to claim 7, wherein the data bus carries addressing, configuration and control data.

9. The programmable array according to claim 5 wherein the memory array further comprises memory cells organized as a plurality of configurable logic blocks.

10. The programmable array according to claim 9 wherein the processor further comprises a memory for use in temporarily storing configurable logic block data during gate array logic configuration.

11. The programmable array according to claim 10 wherein the processor further comprises logic for identifying and decoding programming instructions.

12. The programmable array according to claim 5 wherein configuration data is loaded into the frame register under the control of the processor.

13. The system of claim 5, further comprising, an accumulator register coupled to receive data from the arithmetic logic unit and provide data to the arithmetic logic unit.

14. The programmable gate array of claim 5, wherein the processor has means for loading a variable number of bits into the frame register in response to one or more of the programming instructions.

15. The programmable gate array of claim 5, wherein the processor has means for reading an addressable row of data from the memory array into the frame register in response to one or more of the programming instructions.

16. The programmable gate array of claim 5, wherein the processor has means for transmitting data from the frame register to a data output terminal of the programmable gate array in response to an instruction.

17. The programmable gate array of claim 5, wherein the processor has means for transmitting an instruction address received from the bitstream to an instruction address output terminal of the programmable gate array in response to an instruction.

18. The system of claim 5, wherein the processor has means for transmitting an instruction address received from the bitstream to an instruction address output terminal of the programmable gate array in response to an instruction;

means for reading an addressable row of data from the memory array into the frame register in response to an instruction means for transmitting data from the frame register to a data output terminal of the programmable gate array in response to an instruction; and means for loading a variable number of bits into the frame register in response to an instruction.

19. An apparatus for configuring the configuration memory array of a field programmable gate array (FPGA) comprising:

means for encoding gate array configuration data with programming instructions to produce encoded bitstream data;

means for transferring bitstream data to the FPGA;

means for receiving the bitstream data into a CPU on the FPGA; and means for performing arithmetic functions to configure the FPGA in response to programming instructions in the bitstream.

20. The apparatus for configuring the configuration memory array of a field programmable gate array (FPGA) according to claim 19, the apparatus further comprising means for decoding the bitstream data to separate the programming instructions from the configuration data.

21. The apparatus for configuring the configuration memory array of a field programmable gate array (FPGA) according to claim 19, the apparatus further comprising means for selectively transferring configuration data from the CPU to the configuration memory array responsive to the programming instructions.

22. The apparatus for configuring the configuration memory array of a field programmable gate array (FPGA) according to claim 19 wherein the CPU comprises means for temporarily storing configuration data.

23. A method for configuring the configuration memory array of a field programmable gate array (FPGA), the method comprising the steps:

encoding gate array configuration data with programming instructions to produce encoded bitstream data;

transferring bitstream data to the FPGA;

receiving the bitstream data into a CPU on the FPGA;

decoding the bitstream data to a separate the programming instructions from the configuration data; and performing arithmetic functions to configure the FPGA in response to programming instructions in the bitstream.

24. The method for configuring the configuration memory array of a field programmable gate array (FPGA) according to claim 23, the method further comprising the step of selectively transferring configuration data from the CPU to the configuration memory array responsive to the programming instructions.

25. The method for configuring the configuration memory array of a field programmable gate array (FPGA) according to claim 23, wherein the FPGA further comprises a frame register coupled between the CPU and the configuration memory for temporarily storing configuration data transferred from the CPU to the configuration memory array.

26. The method for configuring the configuration memory array of a field programmable gate array (FPGA) according to claim 23, wherein the frame register is controlled by the CPU.

27. The method for configuring the configuration memory array of a field programmable gate array (FPGA) according to claim 23, wherein the FPGA further comprises a shift register coupled between the CPU and the configuration memory for addressing specific rows of the configuration memory.

28. The method for configuring the configuration memory array of a field programmable gate array (FPGA) according to claim 23, wherein row addressing of the shift register is controlled by the CPU.

29. A programmable gate array, comprising:

a processor having an input port for receiving a bitstream, the bitstream having configuration data and programming instructions, the processor for separating the configuration data from the programming instructions and executing the programming instructions, and the processor having a control state machine coupled to receive the configuration bitstream for decoding programming instructions and providing control signals; and an arithmetic logic unit coupled to receive a control signal from the control state machine and for performing arithmetic functions in response to programming instructions in the bitstream; and a memory array having a plurality of memory cells for receiving and storing configuration data transmitted from the processor.

30. The programmable array according to claim 6 further comprising a shift register coupled to the processor for addressing rows of the memory array.

* * * * *